United States Patent
Waldron et al.

(10) Patent No.: US 10,985,546 B2
(45) Date of Patent: Apr. 20, 2021

(54) LOW-LOSS AND FAST ACTING SOLID-STATE BREAKER

(71) Applicant: Excelitas Technologies Corp., Waltham, MA (US)

(72) Inventors: John E. Waldron, Clifton Park, NY (US); Kenneth Brandmier, Coatesville, PA (US); James K. Azotea, Saratoga Springs, NY (US)

(73) Assignee: Excelitas Technologies Corp., Waltham, MA (US)

( * ) Notice: Subject to any disclaimer, the term of this patent is extended or adjusted under 35 U.S.C. 154(b) by 0 days.

(21) Appl. No.: 16/252,651

(22) Filed: Jan. 20, 2019

(65) Prior Publication Data
US 2019/0229519 A1    Jul. 25, 2019

Related U.S. Application Data

(63) Continuation of application No. 15/346,226, filed on Nov. 8, 2016, now Pat. No. 10,193,322, which is a
(Continued)

(51) Int. Cl.
*H02H 3/033* (2006.01)
*H02H 3/08* (2006.01)
(Continued)

(52) U.S. Cl.
CPC ............ *H02H 3/033* (2013.01); *H02H 3/027* (2013.01); *H02H 3/08* (2013.01); *H02H 3/20* (2013.01);
(Continued)

(58) Field of Classification Search
CPC ...... H02H 3/00–52; H02H 3/033; H02H 3/08; H03K 17/567; H03K 17/0416; H02P 29/024
See application file for complete search history.

(56) References Cited

U.S. PATENT DOCUMENTS 3,800,185 A   3/1974  Anton et al.
4,028,737 A   6/1977  Bailey
(Continued)

FOREIGN PATENT DOCUMENTS

CN   101546908   9/2009
CN   202696106   1/2013
(Continued)

OTHER PUBLICATIONS

Supplementary European Search Report for EP16864898, dated May 29, 2019, 8 pages.
(Continued)

*Primary Examiner* — Jared Fureman
*Assistant Examiner* — Christopher J Clark
(74) *Attorney, Agent, or Firm* — Peter A. Nieves; Sheehan Phinney Bass & Green PA

(57) ABSTRACT

A circuit including a source, a load, and an isolation circuit for controllably isolating the load from the source. The isolation circuit is disposed between the source and the load. The isolation circuit includes at least one insulated-gate bipolar transistor (IGBT) and at least one gate turn-off thyristor (GTO) in parallel with the insulated-gate bipolar transistor. When no fault condition exists, the GTO is configured to be ON to couple the load to the source. When a fault condition exists, the at least one IGBT is configured to turn ON. After the at least one IGBT turns ON, the at least one GTO is configured to turn OFF. After a predetermined amount of time, reflecting the post fabrication alteration to the GTO's minority carrier lifetime (e.g. electron irradiation), after the at least one GTO turns OFF, the at least one IGBT is configured to turn OFF. Alternatively, the circuit is used as an inverter switch, where at the command to turn ON is supplied, the at least one IGBT is turned ON, followed by the at least one SGTO. When commanded to turn OFF the
(Continued)

at least one SGTO is turned OFF followed by the at least one IGBT. This alternative configuration allows the robust, controllable switching speeds of IGBTs and the superior conduction efficiency of SGTOs. The two configurations mentioned above utilize a wide range of SGTO performance, thus the ability to control the SGTOs turn-off speed by reducing its minority carrier lifetime after the device is processed is of large importance. The efficiency of all uses of the circuit can be optimized with the judicious selection of SGTO minority carrier lifetime and the ratio of active area between the SGTO and IGBT devices. In all cases there is a balance between the time the circuit can achieve hard turn-off without current commutation, the conduction efficiency of the circuit and the maximum amount of controllable current. In all cases both the conduction efficiency of the circuit is higher than an IGBT-only based circuit, and the switching performance is higher than a GTO-only based circuit.

6 Claims, 11 Drawing Sheets

Related U.S. Application Data continuation-in-part of application No. 14/991,259, filed on Jan. 8, 2016, now Pat. No. 10,193,324.

(60) Provisional application No. 62/255,104, filed on Nov. 13, 2015.

(51) Int. Cl.
*H02H 3/20* (2006.01)
*H03K 17/0416* (2006.01)
*H02H 3/027* (2006.01)
*H02H 3/44* (2006.01)
*H03K 17/567* (2006.01)

(52) U.S. Cl.
CPC ........... *H02H 3/44* (2013.01); *H03K 17/0416* (2013.01); *H03K 17/567* (2013.01)

(56) References Cited

U.S. PATENT DOCUMENTS

| | | | |
|---|---|---|---|
| 4,509,089 A | 4/1985 | Svedberg | |
| 5,274,524 A | 12/1993 | Pezzani et al. | |
| 5,517,378 A | 5/1996 | Asplund et al. | |
| 5,631,494 A * | 5/1997 | Sakurai | H01L 27/0248 257/139 |
| 5,726,843 A | 3/1998 | Arita et al. | |
| 6,108,223 A | 8/2000 | Julian et al. | |
| 6,326,648 B1 | 12/2001 | Jalade et al. | |
| 6,893,757 B2 | 5/2005 | Kato | |
| 7,158,393 B2 | 1/2007 | Schneider | |
| 7,643,323 B2 | 1/2010 | Azuma et al. | |
| 7,692,211 B1 | 4/2010 | Temple et al. | |
| 7,768,758 B2 | 8/2010 | Maier et al. | |
| 8,649,192 B2 | 2/2014 | Frey | |
| 9,247,590 B2 | 1/2016 | Fukutani et al. | |
| 9,942,949 B2 | 4/2018 | Fukutani et al. | |
| 2010/0072512 A1 | 3/2010 | Giorgi et al. | |
| 2012/0305547 A1 | 12/2012 | Fukutani et al. | |
| 2013/0257177 A1 | 10/2013 | Jacobson et al. | |
| 2015/0116881 A1 | 4/2015 | Burnett et al. | |

FOREIGN PATENT DOCUMENTS

| | | |
|---|---|---|
| CN | 202930899 U | 5/2013 |
| CN | 102652459 | 9/2014 |
| DE | 3603050 A1 | 8/1987 |
| EP | 159663 A2 | 10/1985 |
| EP | 0660352 A1 | 6/1995 |
| EP | 2899824 | 7/2015 |

OTHER PUBLICATIONS

Thorsten Völker "Power Transmission from Offshore Wind Farms"; Univ. of Applied Sciences, pp. 51-59.

Andersson, et al. "Two Novel Thyristor based HVDC Topologies for Independent Control of Active and Reactive Power"; International High Voltage Direct Current 2015 Conference, Oct. 18-22, 2015, Seoul , Korea, pp. 180-187.

International Search Report and Written Opinion issued in PCT/US2018/061096 dated Mar. 13, 2017.

* cited by examiner

LOW-LOSS AND FAST ACTING SOLID-STATE BREAKER

CROSS REFERENCE TO RELATED APPLICATION

This application is a continuation of U.S. patent application Ser. No. 15/346,226, filed Nov. 8, 2016, now U.S. Pat. No. 10,193,322, which k continuation-in-part of U.S. patent application Ser. No. 14/991,259, filed Jan. 8, 2016, which claims the benefit of U.S. Provisional Application No. 62/255,104, entitled "Low-Loss and Fast Acting Solid State AC and DC Breaker" and filed Nov. 13, 2015. The content contents of those applications are incorporated herein by reference.

FIELD OF THE INVENTION

The present invention relates to a solid-state circuit/switch for use as a breaker, a fault current limiter, or a static transfer switch and, more specifically, to a circuit comprising one or more IGBTs in parallel with one or more GTOs for use as a breaker, a fault current limiter, a static transfer switch or any application to connect and/or disconnect a load from an energy source.

BACKGROUND OF THE INVENTION

Increased generation capacity and the desire to incorporate smart grid technology in the power grid has generated much interest in solid state technology replacing legacy mechanical breakers. Solid state replacement of mechanical breakers offers response time improvements of orders of magnitude while significantly improving the lifetime of the switch by eliminating electrode erosion. Solid state breakers, unfortunately, introduce higher losses under normal conduction conditions compared to mechanical breakers and often require bulky cooling systems.

There is a need for a solid-state breaker with lower losses under normal conduction conditions.

SUMMARY OF THE INVENTION

In accordance with an aspect of the present invention, there is provided a circuit for isolating a load from a source. The circuit includes at least one insulated-gate bipolar transistor and at least one gate turn-off thyristor in parallel with the insulated-gate bipolar transistor.

In accordance with another aspect of the present invention, there is provided a circuit comprising one or more gate turn-off thyristors (GTOs) in parallel with one or more insulated-gate bipolar transistors (IGBTs). In such circuit, the anodes of the one or more GTOs are coupled to one another; the collectors of the one or more IGBTs are coupled to one another; and the coupled anodes of the one or more GTOs are coupled to the coupled collectors of the one or more IGBTs. The cathodes of the one or more GTOs are coupled to one another; the emitters of the one or more IGBTs are coupled to one another; and the coupled cathodes of the one or more GTOs are coupled to the coupled emitters of the one or more IGBTs. The gates of the one or more GTOs are coupled to one another, and the gates of the one or more IGBTs are coupled to one another. The gates of the coupled one or more GTOs are not coupled to the coupled gates of the one or more IGBTs.

In accordance with yet another exemplary aspect of the present invention, there is provided circuit including a source, a load, and an isolation circuit for controllably isolating the load from the source. The isolation circuit is disposed between the source and the load. The isolation circuit includes at least one insulated-gate bipolar transistor (IGBT) and at least one gate turn-off thyristor (GTO) in parallel with the insulated-gate bipolar transistor. When no fault condition exists, the GTO is configured to be ON to couple the load to the source. When a fault condition exists, the at least one IGBT is configured to turn ON. After the at least one IGBT turns ON, the at least one GTO is configured to turn OFF. After a predetermined amount of time after the at least one GTO turns OF the at least one IGBT is configured to turn OFF

BRIEF DESCRIPTION OF THE DRAWINGS

For the purpose of illustration, there are shown in the drawings certain embodiments of the present invention. In the drawings, like numerals indicate like elements throughout. It should be understood that the invention is not limited to the precise arrangements, dimensions, and instruments shown. In the drawings.

DETAILED DESCRIPTION OF THE INVENTION

Figure 1A:
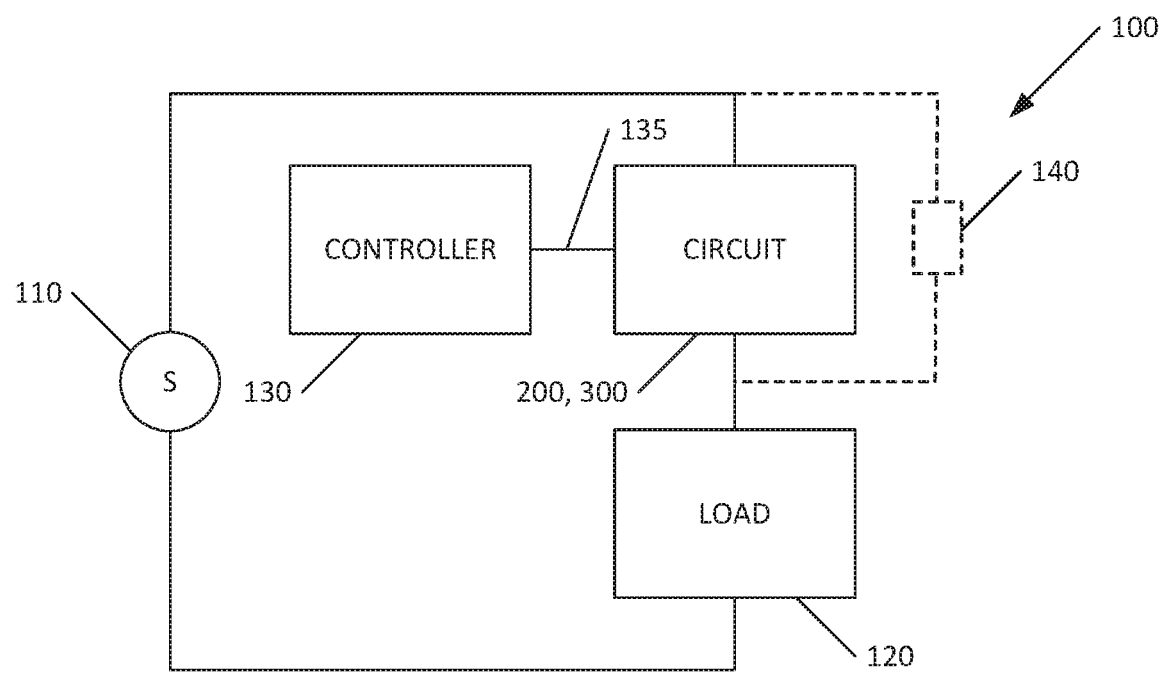
FIG. 1A illustrates a diagram of a circuit comprising a source, a load, a circuit for isolating the load from the source, and a controller for controlling the isolation circuit, in accordance with an exemplary embodiment of the present invention.

Reference to the drawings illustrating various views of exemplary embodiments of the present invention is now made. In the drawings and the description of the drawings herein, certain terminology is used for convenience only and is not to be taken as limiting the embodiments of the present invention. Furthermore, in the drawings and the description below, like numerals indicate like elements throughout.

A thyristor is turned ON by a gate signal. Once the gate signal is removed, the thyristor remains in the ON-state until the current flowing through the anode of the thyristor falls below a certain threshold value. A gate turn-off thyristor (GTO) can be turned ON by a gate signal of a positive current pulse between the gate and cathode terminals, and turned OFF by a gate signal of negative polarity between the gate and cathode terminals.

Thyristors and GTOs suffer from long switch-OFF times. After the turn-OFF current in the thyristor's anode terminates or the turn-OFF current in the GTO's gate terminates, there is a long tail time where residual current continues to flow until all remaining charge from the device dissipates. This phenomenon limits the maximum amount of current a thyristor can interrupt without failure.

Thyristors and GTOs support higher current density with a lower forward drop, $V_F$, compared to insulated-gate bipolar transistors (IGBTs). IGBTs, however, have a much higher maximum controllable current density than GTOs at operational voltage. 6 kV GTOs have demonstrated turn-OFF capability of 3 kA/cm$^2$ when switched at 700V.

To approach a turn-OFF capability of 3 kA/cm$^2$ when switched at 700V in a GTO, a snubber circuit may be utilized to delay the reapplied voltage across the GTO during turn-OFF. A snubber circuit adds volume and weight to the system in which the GTO is employed and has limited effect on the turn-OFF current density of the GTO. It would be advantageous to provide an AC or DC breaker, current limiter or any solid state switching application that takes advantage of the lower $V_F$ of GTOs while providing for a greater maximum controllable current density than GTOs.

Referring now to FIG. 1A, there is illustrated a diagram of a circuit, generally designated as 100, in accordance with an exemplary embodiment of the present invention. The circuit 100 comprises a source 110, a load 120, a controller 130, and a circuit 200 or 300 for selectively isolating the load 120 from the source 110. The controller 130 is connected to and controls the circuit 200, 300 by sending a signal via a signal line 135 to open and close, thereby respectively uncoupling and coupling the source 110 from/to the load 120.

The circuit 200, 300 may be controlled to act as an AC or DC breaker to protect the load 120 from overvoltage or overcurrent. In such embodiment, the controller 130 senses the voltage across or current through the load 120. When the controller 130 detects an overvoltage/overcurrent, it commands the circuit 200, 300 to turn OH, thereby decoupling the source 110 from the load 120. When the controller 130 determines that the overvoltage/overcurrent has been removed, it may command the circuit 200, 300 to turn ON, thereby coupling the source 110 to the load 120.

The circuit 200, 300 may be controlled to act as a current limiter to protect the load 120 from overcurrent. In such embodiment, the controller 130 senses the current through the load 120. When the controller 130 detects an overcurrent, it commands the circuit 200, 300 to turn OFF, thereby decoupling the source 110 from the load 120. The current is then diverted to an external reactance 140, which is in parallel with the circuit 200, 300 in exemplary alternative embodiments of the circuit 100, thereby limiting the current delivered to the load 120 to a predetermined value. When the controller 130 determines that the overcurrent has been removed, it may command the circuit 200, 300 to turn ON, thereby coupling the source 110 to the load 120.

Figure 1B:
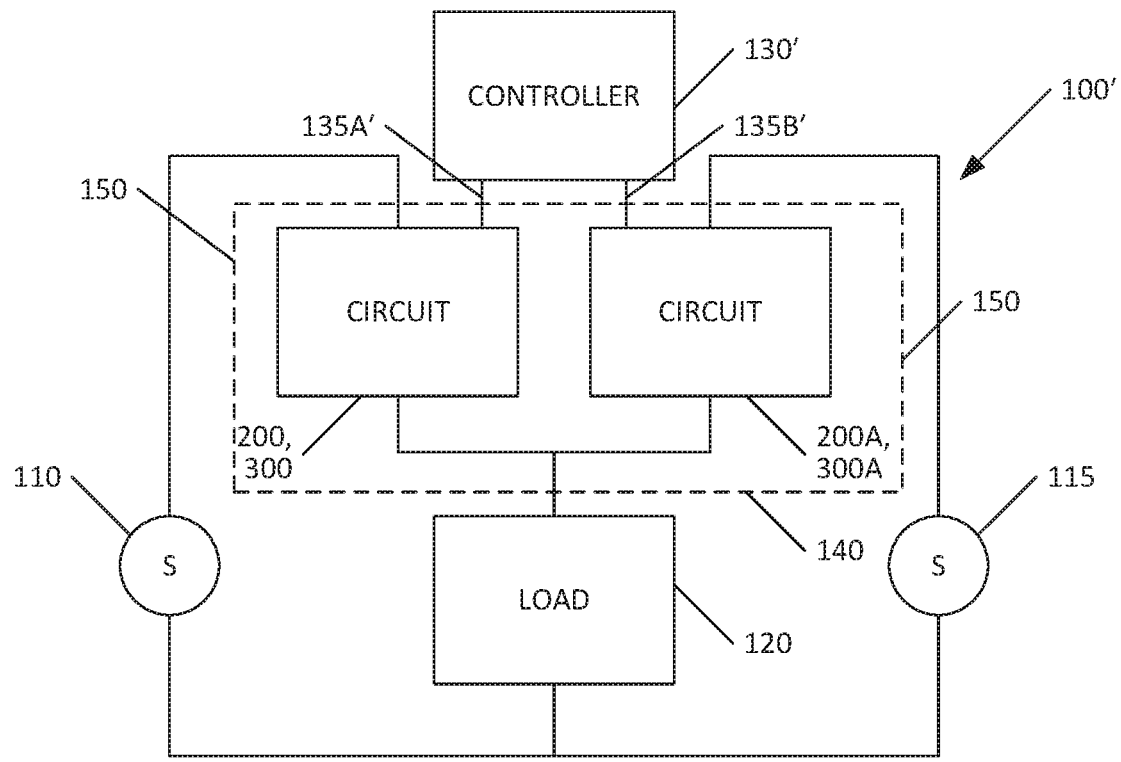
FIG. 1B illustrates a diagram of a circuit comprising a plurality of sources, a load, and a plurality of switching circuits, each configured for selectively coupling a respective one of the plurality of sources to the load in response to a control signal received from a controller, in accordance with an exemplary embodiment of the present invention.

Referring now to FIG. 1B, there is illustrated a diagram of a circuit, generally designated as 100', in accordance with an exemplary embodiment of the present invention. The circuit 100' comprises all of the components of the circuit 100 and additional components. The circuit 100' comprises the source 110, the load 120, a source 115, the circuit 200, 300, a circuit 200A, 300A, and an exemplary embodiment of the controller 130, generally designated in FIG. 1B as 130'. The circuit 200, 300 is configured for switching the source 110 to the load 120, and the circuit 200A, 300A is configured for switching the source 115 to the load 120.

The controller 130' is connected to and controls the circuits 200, 300 and 200A, 300A via respective signals on respective signal lines 135A' and 135B'. The controller 130' controls the circuit 200, 300 to open and close, thereby uncoupling and coupling the source 110 from/to the load 120. The controller 130' controls the circuit 200A, 300A to open and close, thereby uncoupling and coupling the source 115 from/to the load 120. The controller 130' controls the circuits 200, 300 and 200A, 300A together to switch the load 120 between the sources 110 and 115. Thus, the circuits 200 and 200A collectively form a transfer switch 150 to transfer the source coupled to the load 120 from the source 110 to the source 115 or from the source 115 to the source 110. Likewise, the circuits 300 and 300A collectively form a transfer switch 150 to transfer the source coupled to the load 120 from the source 110 to the source 115 or from the source 115 to the source 110.

The circuits 200, 300 can each have one or more SGTOs coupled to one or more IGBTs. For example referring now to FIG. 2, there is illustrated an exemplary embodiment of the circuits 200 and 200A, in accordance with an exemplary embodiment of the present invention. Each of the circuits 200 and 200A comprises an IGBT 210.1 connected in parallel with two GTOs 220.1 and 220.2. The IGBT 210.1 comprises a collector 210.1-C, a gate 210.1-G, and an emitter 210.1-E. The GTO 220.1 comprises an anode 220.1-A, a gate 220.1-G, and a cathode 220.1-K. The GTO 220.2 comprises an anode 220.2-A, a gate 220.2-G, and a cathode 220.2-K. In an exemplary embodiment, the GTOs 220.1 and 220.2 are super GTOs, such as those described in U.S. Pat. No. 7,692,211 to Temple et al., issued Apr. 6, 2010, and having the same assignee as the present application, the contents of which patent are incorporated herein by this reference. In another exemplary embodiment, the GTOs 220.1 and 220.2 may instead be MOS-controlled thyristors (MCTs), such as those described in EP 159663A2, published Oct. 30, 1985, the contents of which application are incorporated herein by this reference.

The anodes 220.1-A and 220.2-A of the respective GTOs 220.1 and 220.2 are connected together. The cathodes 220.1-K and 220.2-K of the respective GTOs 220.1 and 220.2 are connected together. The gates 220.1-G and 220.2-G of the respective GTOs 220.1 and 220.2 are connected together. Thus, the GTOs 220.1 and 220.2 are connected in parallel, and because the gates 220.1-G and 220.2-G of the respective GTOs 220.1 and 220.2 are connected together, the GTOs 220.1 and 220.2 are controlled by the same gate signal present on the signal line 135, 135A', 135B'.

The collector 210.1-C of the IGBT 210.1 is connected to the connected anodes 220.1-A and 220.2-A of the respective GTOs 220.1 and 220.2. The emitter 210.1-E of the IGBT 210.1 is connected to the connected cathodes 220.1-K and 220.2-K of the respective GTOs 220.1 and 220.2. Thus, the IGBT 210.1 is connected in parallel with the GTOs 220.1 and 220.2. The gate 210.1-G of the IGBT 210.1 is not connected to the connected gates 220.1-G and 220.2-G of the respective GTOs 220.1 and 220.2. Thus, the IGBT 210.1 may be controlled independently from the GTOs 220.1 and 220.2 for the reasons discussed herein below. The IGBT 210.1 is controlled by a gate signal present on the signal line 135, 135A', 135B'

Figure 3:
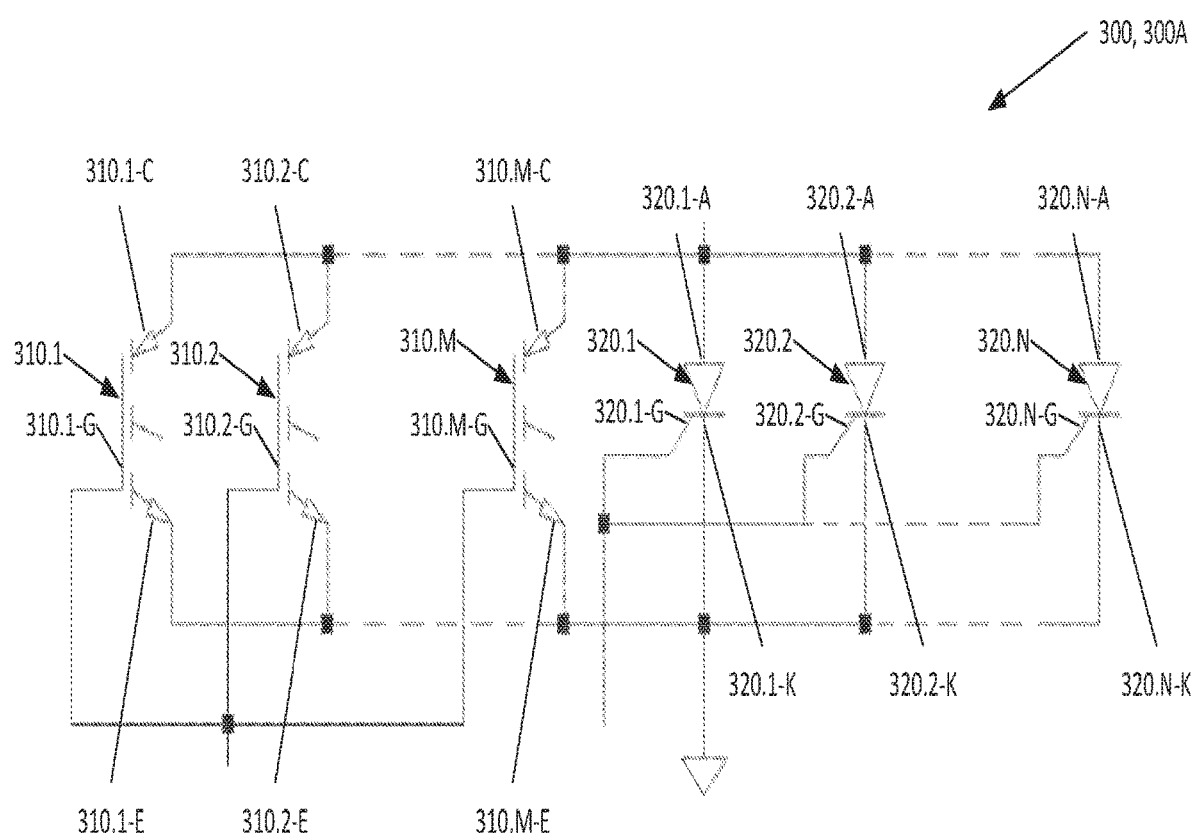
FIG. 3 illustrates a second exemplary embodiment of a circuit for use as the isolation circuit of FIGS. 1A and 1C or each of the switching circuits of FIG. 1B, the circuit of FIG. 3 comprising a plurality of IGBTs in parallel with a plurality of GTOs, in accordance with an exemplary embodiment of the present invention.

Referring now to FIG. 3, there is illustrated an exemplary embodiment of the circuits 300 and 300A, in accordance with an exemplary embodiment of the present invention. Each of the circuits 300 and 300A comprises a plurality of IGBTs 310.11, connected in parallel with a plurality of GTOs 320.1, 320.2, ..., 320.N. Each IGBT 310.1, 310.2, ..., 310.M comprises a respective collector 310.1-C. 310.2-C, ..., 310.M-C, a respective gate 310.1-G, 310.2-G, ..., 310.M-G, and a respective emitter 310.1-E, 310.2-E, ..., 310.M-E. Each GTO 320.1, 320.2, ..., 320.N comprises a respective anode 320.1-A, 320.2-A, ..., 320.N-A, a respective gate 320.1-G, 320.2-G, ..., 320.N-G, and a respective cathode 320.1-K, 320.2-K, ..., 320.N-K. In an exemplary embodiment, the GTOs 320.1, 320.2, ..., 320.N are super GTOs, such as those described in U.S. Pat. No. 7,692,211 to Temple et al., issued Apr. 6, 2010, and having the same assignee as the present application, the contents of which patent are incorporated herein by this reference. In another exemplary embodiment, the GTOs 320.1, 320.2, ..., 320.N may instead be MCTs, such as those described in EP 159663A2, published Oct. 30, 1985, the contents of which application are incorporated herein by this reference.

The collectors 310.1-C, 310.2-C, ..., 310.M-C of the respective IGBTs 310.1, 310.2, ..., 310.M are connected together. The emitters 310.1-E, 310.2-E, ..., 310.M-E of the respective IGBTs 310.1, 310.2, ..., 310.M are connected together. The gates 310.1-G, 310.2-G, ..., 310.M-G of the respective IGBTs 310.1, 310.2, ..., 310.M are connected together. Thus, the IGBTs 310.1, 310.2, ..., 310.M are connected in parallel, and because the gates 310.1-G, 310.2-G, ..., 310.M-G of the respective IGBTs 310.1, 310.2, ..., 310.M are connected together, the IGBTs 310.1, 310.2, ..., 310.M are controlled by a gate signal present on the signal line 135, 135A', 135B'.

The anodes 320.1-A, 320.2-A, ..., 320.N-A of the respective GTOs 320.1, 320.2, ..., 320.N are connected together. The cathodes 320.1-K, 320.2-K, ..., 320.N-K of the respective GTOs 320.1, 320.2, ..., 320.N are connected together. The gates 320.1-G, 320.2-G, ..., 320.N-G of the respective GTOs 320.1, 320.2, ..., 320.N are connected together. Thus, the GTOs 320.1, 320.2, ..., 320.N are connected in parallel, and because the gates 320.1-G, 320.2-G, ..., 320.N-G of the respective GTOs 320.1, 320.2, ..., 320.N are connected together, the GTOs 320.1, 320.2, ..., 320.N are controlled by a gate signal present on the signal line 135, 135A', 135b'.

The connected collectors 310.1-C, 310.2-C, ..., 310.M-C of the IGBTs 310.1, 310.2, ..., 310.M are connected to the connected anodes 320.1-A, 320.2-A, ..., 320.N-A of the GTOs 320.1, 320.2, ..., 320.N. The connected emitters 310.1-E, 310.2-E, ..., 310.M-E of the IGBTs 310.1, 310.2, ..., 310.M are connected to the connected cathodes 320.1-K, 320.2-K, ..., 320.N-K of the GTOs 320.1, 320.2, ..., 320.N. Thus, the IGBTs 310.1, 310.2, ..., 311.0.M are connected in parallel with the GTOs 320.1, 320.2, ..., 320.N. The connected gates 310.1-G, 310.2-G, ..., 310.M-G of the IGBTs 310.1, 310.2, ..., 310.M are not connected to the connected gates 320.1-G, 320.2-G, ..., 320.N-G of the GTOs 320.1, 320.2, ..., 320.N. Thus, the IGBTs 310.1, 310.2, ..., 310.M may be controlled independently from the GTOs 320.1, 320.2, ..., 320.N.

Figure 2:
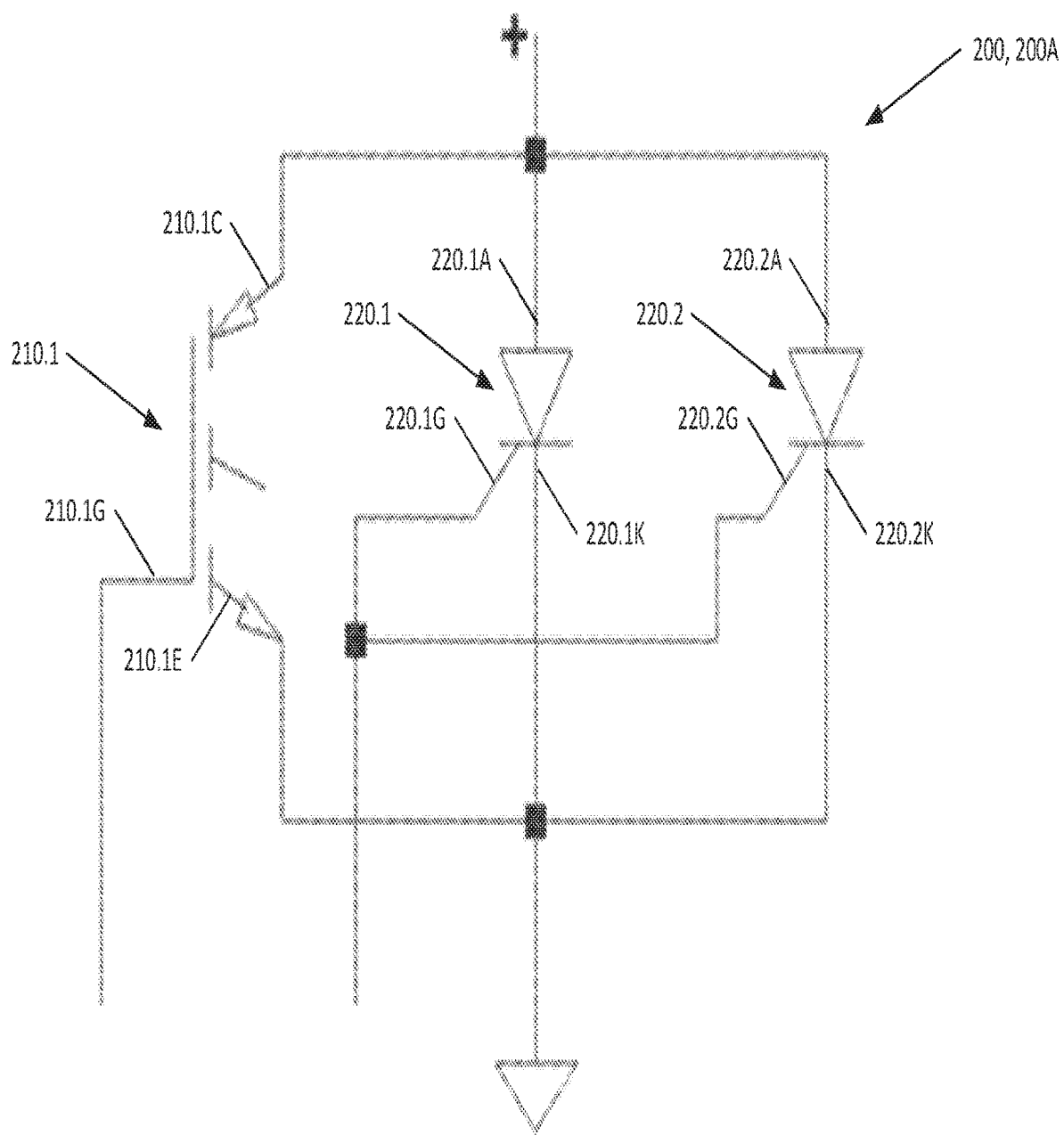
FIG. 2 illustrates a first exemplary embodiment of a circuit for use as the isolation circuit of FIGS. 1A and 1C or each of the switching circuits of FIG. 1B, the circuit of FIG. 2 comprising an insulated-gate bipolar transistor (IGBT) in parallel with two gate turn-off thyristors (GTOs), in accordance with an exemplary embodiment of the present invention.

With reference to FIGS. 1A, 2, and 3, in applications where low-frequency turn-OFF is satisfactory, the GTOs 220, 320 of the respective circuits 200, 300 are used to carry nominal load 120 current while the IGBTs 210, 310 are OFF. Therefore, the junction temperature of the IGBTs 210, 310 is much lower than the junction temperature of the GTOs 220, 320. The maximum controllable current of the IGBTs 210, 310 is thereby increased compared to the maximum current they would be able to control were they used to carry a portion or all of the load 120 current. In inverter-like applications it is advantageous to maintain both SGTOs and IGBTs in the on-state when the module is commanded ON.

A simulation of the breaker or limiter 300 in which there were two IGBTs 310.1 and 310.2 and two GTOs 320.1 and 320.2 was performed. Heat was simulated as being conducted through 8 mils of Cu, 40 mils of AlN, 4 mils of thermal grease, and 300 mils of AlSiC while the GTOs 320.1 and 320.2 were ON and the IGBTs 310.1 and 310.2 were OFF. The simulation showed that the maximum temperature gradient in the GTOs 320.1 and 320.2 was 39° C. and that the maximum temperature gradient in the IGBTs 310.1 and 310.2 was 8.8° C. Thus, the temperature gradient across the IGBTs 310.1 and 310.2 was shown to be significantly lower than the temperature gradient across the GTOs 320.1 and 320.2.

With continued reference to FIGS. 1A, 2, and 3, because of the low forward voltage drop of the GTOs 220, 320 at the same current density compared to the IGBTs 210, 310, fewer GTOs 220, 320 and a smaller active area in the circuit 200, 300 are needed to carry nominal current in the circuit 100 compared to a circuit in which only IGBTs are used to carry the nominal current. Furthermore, the use of GTOs 220, 320 in the circuits 200, 300 to carry the nominal current provides similar or even lower losses than a circuit in which only IGBTs are used to carry the nominal current. Thus, the circuit 100 may omit a cooling system for the circuits 200, 300. Additionally, the circuit 100 may omit snubber circuitry, in some embodiments, or include snubber circuitry that is greatly reduced in size compared to conventional breakers or current limiters.

Figure 4:
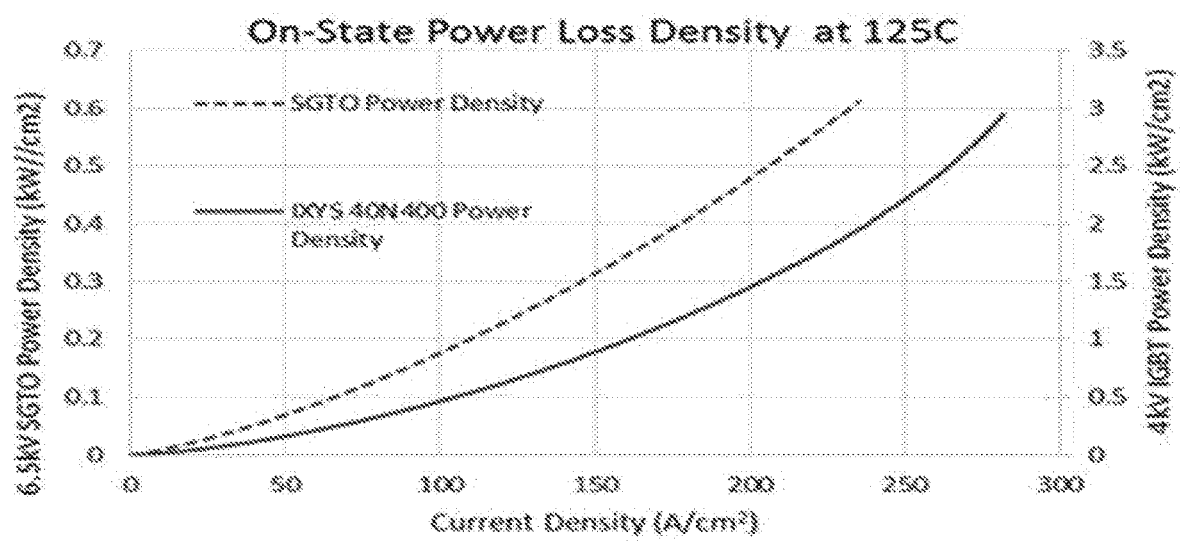
FIG. 4 illustrates power loss of an exemplary super gate turn-off thyristor (SGTO) versus an exemplary IGBT, in accordance with an exemplary embodiment of the present invention.

Referring to FIG. 4, there is illustrated a graph of current density versus power density for a 6 kV super GTO (SGTO) manufactured by Silicon Power, Inc. (part no. CCSTA14N40) and a commercial IGBT manufactured by Silicon Corporation (part no. IXEL40N400). The SGTO is the combination of a GTO with very high cell density and metallization mated to a ceramic package. The $V_F$ of the SGTO and the IGBT were characterized and their losses compared in a breaker configuration, such as in the circuit 100, where only $V_F$ has a meaningful impact on system losses. As shown in FIG. 4, the SGTO offers two orders of magnitude improvement in conduction loss/cm² compared to an IGBT only configuration at all current densities.

With continued reference to FIGS. 1A, 2, and 3, the circuit 200, 300 may be controlled by the controller 130 to act as a breaker or a current limiter in the circuit 100. During routine use, the circuit 200, 300 conducts current to the load 120. When the controller 130 detects a fault (either an overvoltage across the load 120 or an overcurrent to the load 120), the controller 130 sends a command to the gates of the IGBTs 210, 310 via the signal line 135 to turn ON, and then a command to the gates of the GTOs 220, 320 via the signal line 135 to turn OFF. Because the IGBTs 210, 310 act as an extremely low-voltage clamp operating at their $V_F$, the GTOs 220, 320 are capable of breaking the fault current or overvoltage and transferring it to the IGBTs 210, 310. After a predetermined or programmable delay, the controller 130 commands the IGBTs 210, 310 to turn OFF. Therefore, the circuit 200, 300 is opened, thereby isolating the load 120 from the source 110 and/or fault condition.

The time delay between turn-OFF of the GTOs 220, 320 and turn-OFF of the IGBTs 210, 310 is variable and dependent on the characteristics of the GTOs 220, 320, such as intentional reduction of the GTOs' minority carrier lifetime and their operating temperature. As the operating temperature of the GTOs 220, 320 increases, a longer delay between turn-OFF of the GTOs 220, 320 and turn-OFF of the IGBTs 210, 310 is required because the minority carrier lifetime increases with temperature of the GTOs 220, 320. However, in the event the minority carrier lifetime is intentionally decreased after device fabrication (e.g. electron irradiated), the delay between turn-OFF of the GTOs and IGBTs can be lowered. Effectively, the predetermined time delay can have a set minimum value at the circuits' minimum operating temperature, giving the ability for the controller to adjust that delay upward as the circuits' temperature increases. The lower bound of this delay is a function of the GTOs' low temperature minority carrier lifetime, the upper bound being a function of the GTOs' minority carrier lifetime at the circuits' maximum operating temperature. The variation in the circuits' requisite delay allows the controller to adjust the delay between turn OFF of the IGBT and SGTO in real time, based on temperature feedback provided by the circuit, such as by a temperature sensor or the like. Thus, the delay can be a fixed value or the controller can by dynamic and provide a delay in real time. This function enables lower switching losses at lower temperatures compared to a fixed delay that must accommodate the longest delays found at high temperature operation. In an exemplary embodiment, the maximum rated operating temperature of the GTOs 220, 320 is 125 C at the blocking junction and 85C at the heatsink to which the GTOs 220, 320 are mounted.

In an exemplary embodiment, the time delay between turn-OFF of the GTOs 220, 320 and turn-OFF of the IGBTs 210, 310 may be between 10 µs and 150 µs, dependent upon the minority carrier lifetime selected for the GTOs. In this embodiment it is assumed the temperature of the circuit operates without significant change, therefore the time delay can be fixed. The interruption time for a mechanical breaker is typically greater than 1 ms and may be greater than 10 ms. Thus, the circuits 200 and 300 are "fast acting" because the time delay between turn-OFF of the GTOs 220, 320 and turn-OFF of the IGBTs 210, 310 is less than ⅙ (and possibly much less) than the interruption time of a mechanical breaker.

Because fault currents generally have a di/dt value, they increase over time. A longer delay between turn-OFF of the GTOs 220, 320 and turn-OFF of the IGBTs 210, 310 results in a higher total current the IGBTs 210, 310 must turn-OFF. Thus, the expected di/dt should be taken into account when establishing the predetermined or programmable delay. The expected increase in current during the delay period may be expressed as:

$$\Delta I = t_{delay} \cdot di/dt' \quad (1)$$

where di/dt is a function related to the source and the fault. The expected di/dt may be calculated based on parasitic system inductance as such:

$$di/dt = V_{source}/L_{system} \quad (2)$$

Figure 5A:
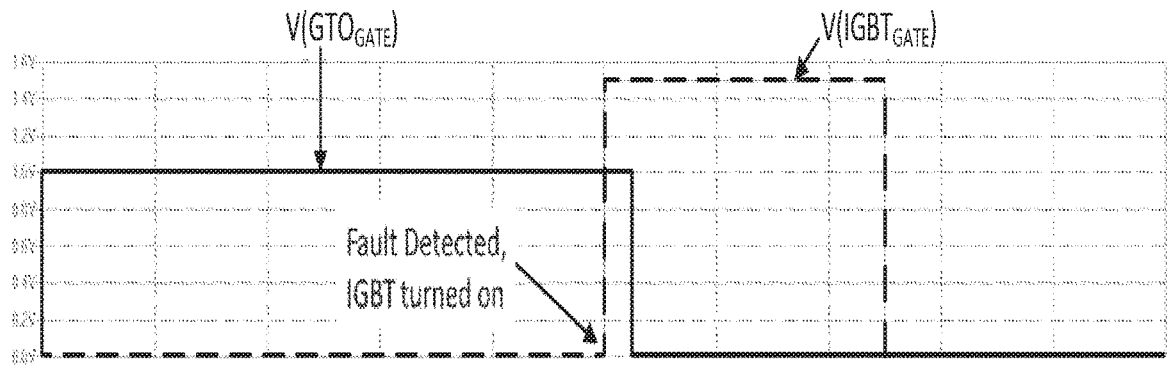
FIG. 5A illustrates gate signals applied in a simulation of the circuit of FIG. 2 in which the two GTOs are simulated as SGTOs, in accordance with an exemplary embodiment of the present invention.
Figure 5B:
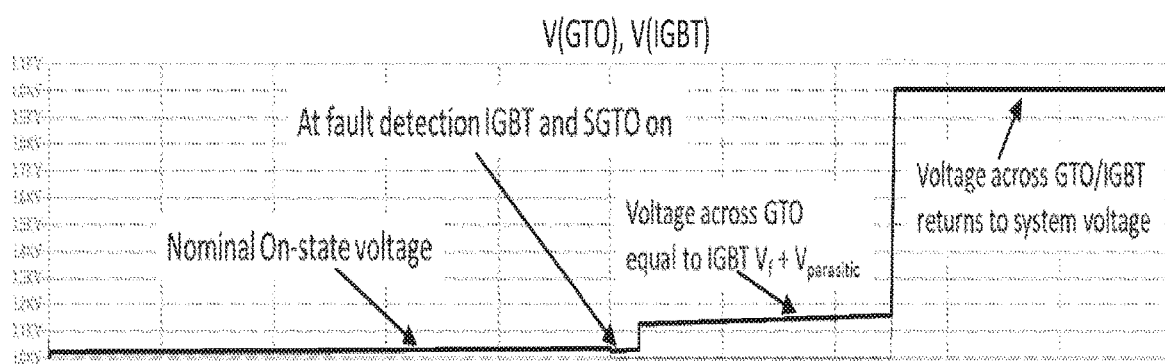
FIG. 5B illustrates voltage across the simulated circuit of FIG. 2, in accordance with an exemplary embodiment of the present invention.
Figure 5C:
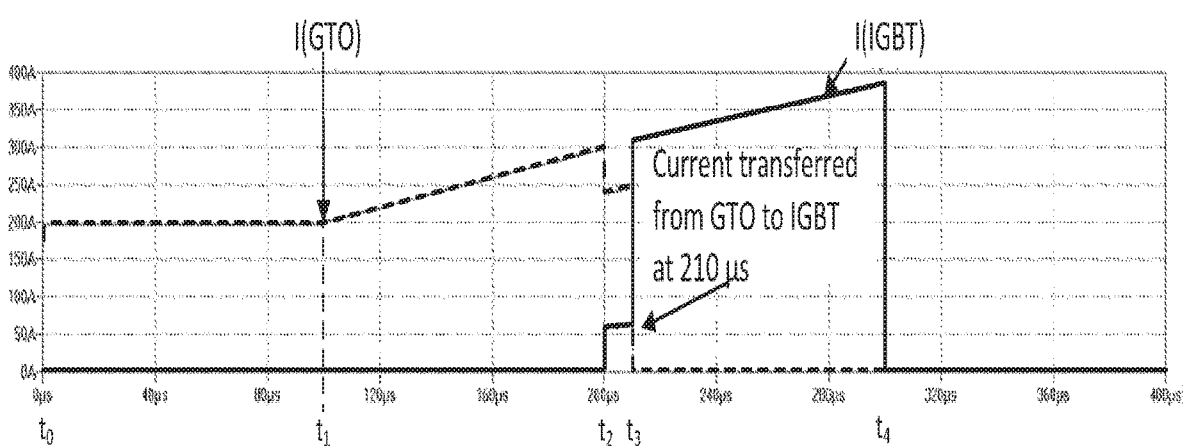
FIG. 5C illustrates current through the IGBT and one of the SGTOs of the simulated circuit of FIG. 2, in accordance with an exemplary embodiment of the present invention.

Illustrated in FIGS. 5A, 5B, and 5C are exemplary gate signals, values of ΔV across the IGBTs 210, 310 and GTOs 220, 320, and values of current through the IGBTs 210, 310 and GTOs 220, 320, respectively, in accordance with an exemplary embodiment of the present invention. Generally, FIGS. 5A through 5C illustrate exemplary operation of the circuits 200, 300. During normal operation, the GTOs 220, 320 are ON because of their lower $V_F$ and power loss than the IGBTs 210, 310. When a fault develops, such as a fault in the system load 120 whereby its reactance or resistance is lowered or a fault resulting from wires shorting, e.g., from downed utility lines, the goal is to turn OFT the GTOs 220, 320 to isolate the load from the fault. However, because the GTOs 220, 320 are optimized for low conduction loss, their stored charge is much higher than a typical IGBT during turn-OFF, thereby lowering their maximum turn-OFF current capability. A path should be provided to allow a low voltage clamp for GTOs 220, 320 to interrupt current at low voltage. Furthermore, because the fault current may continue to rise during the fault, the GTOs 220, 320 should be assisted in handling the fault current. Thus, before turn-OFF of the GTOs 220, 320 commences, the IGBTs 210, 310 are turned ON to provide for the discharge of the stored charge in the GTOs 220, 320 and to handle a portion of the fault current. To ensure that the IGBTs 210, 310 are fully ON when the GTOs 220, 320 are turned OFF, the IGBTs 210, 310 are turned ON before the GTOs 220, 320 are turned OFF. The GTOs 220, 320 are then turned OFF, and their stored charge recombines exponentially with a time constant directly related to the GTO's minority carrier lifetime while the 210, 310 carry the fault current. Turn-OFF of the GTOs 220, 320 while the IGBTs 210, 310 conduct the fault current provides an ultra-low voltage clamp for the GTOs 220, 320, drastically increasing their maximum controllable current density. After a predetermined amount of time to ensure that all or most (e.g., 90%) of the stored charge has discharged, the IGBTs 210, 310 are turned OFF.

FIG. 5A illustrates the gate signals separately provided by the controller 130 to the gates of the IGBTs 210, 310 and the gates of the GTOs 220, 320 during operation over the signal lines 135. Referring to A, during normal operation during time $t_0$ to $t_1$, e.g., 0 µs to 100 µs, the controller 130 applies a gate signal (e.g., 1.0V) to the gates of the GTOs 220, 320. Thus, the load 120 is coupled to the source 110. At time $t_1$, e.g., 100 µs, a fault develops, as best seen in FIGS. 5B and 5C. The controller 130 continues to apply the gate signal (e.g., 1.0V) to the gates of the GTOs 220, 320. At time $t_2$, e.g., 200 µs, the controller 130 reaches its trip point, i.e., it determines that a fault condition (e.g., overcurrent sensed by a current sensor of the controller 130) exists. In the exemplary embodiment illustrated in A, the trip point is 300 A through the circuit 200, 300.

Upon reaching the trip point at time $t_2$, the controller 130 applies a gate signal (e.g., 1.5V) to the gates of all of the IGBTs 210, 310 to turn them ON simultaneously. By time $t_3$, e.g., 210 µs, the IGBTs 210, 310 are ON and conducting. At time $t_3$, e.g., 210 µs, the controller 130 removes the signal from the gates of the GTOs 220, 320, thereby turning them OFF. Because of the stored charge in the GTOs 220, 320, they do not turn OFF instantaneously. By time $t_4$, e.g., 300 µs, most of the charge in the GTOs 220, 320 has dissipated. Thus, at that time, the controller removes the signal from the gates of all of the IGBTs 210, 310, thereby turning them OFF simultaneously. Therefore, the circuit 200, 300 is turned OFF at time $t_4$, thereby isolating the load 120 from the fault condition. The times $t_3$ and $t_4$ are chosen based on the turn-ON time of the IGBTs 210, 310 and the turn-OFF times of the GTOs 220, 320, respectively, so that the IGBTs 210, 310 are fully turned ON by time $t_3$ and the GTOs 220, 320 are fully turned OFF by time $t_4$.

FIG. 5B illustrates the value of ΔV across the IGBTs 210, 310 and GTOs 220, 320 between time $t_0$ to $t_4$, e.g., 0 µs to 400 µs. Because the IGBTs 210, 310 and GTOs 220, 320 are in parallel, ΔV across the IGBTs 210, 310 is equal to ΔV across the GTOs 220, 320. As seen in FIG. 5B, ΔV across the IGBTs 210, 310 and GTOs 220, 320 is about 0.02 kV, the $V_F$ of the GTOs 220, 320, between time $t_0$ to $t_1$, at which time the fault develops. ΔV increases between time $t_1$ and $t_2$, at which time the controller 130 reaches the trip point and turns ON all of the IGBTs 210, 310 simultaneously. ΔV across the IGBTs 210, 310 and GTOs 220, 320 dips at $t_2$ because the current is shared between the IGBTs 210, 310 and GTOs 220, 320 but continues gradually rising until $t_3$, at which time the controller 130 turns OH all of the GTOs 220, 320 simultaneously.

Because the GTOs 220, 320 turn OFF at time $t_3$, ΔV across the IGBTs 210, 310 and GTOs 220, 320 jumps from about 0.03V to about 0.12V, the $V_F$ of the IGBTs 210, 310, at time $t_3$. ΔV continues to climb to about 0.16V at time $t_4$, at which time the controller 130 turns OFF the IGBTs 210, 310. Because both the IGBTs 210, 310 and the GTOs 220, 320 are OFF at time $t_4$, ΔV across the IGBTs 210, 310 and GTOs 220, 320 returns to the system voltage (voltage of the source 110).

FIG. 5C illustrates the current through the IGBTs 210, 310 and GTOs 220, 320 between time $t_0$ to $t_4$, e.g., 0 µs to 400 µs. As seen in C, the current through the GTOs 220, 320 is about 200 A between time $t_0$ to $t_1$, at which time the fault develops. During this time, the current through the IGBTs 210, 310 is 0 A because they are OFF. The current through the GTOs 220, 320 increases between time $t_1$ and $t_2$ to 300 A. At time $t_2$ the controller 130 reaches the trip point and turns ON the IGBTs 210, 310. Between time $t_2$ and $t_3$, the current is divided between the IGBTs 210, 310 and the GTOs 220, 320 but continues to rise through the IGBTs 210, 310 and the GTOs 220, 320 because of the fault condition.

Because the GTOs 220, 320 turn OFF at time $t_3$, the current through the circuit 200, 300 shifts entirely through the IGBTs 210, 310. Because the fault condition persists, the current increases from about 305 A to about 380 A at time $t_4$, at which time the controller 130 turns OFF the IGBTs 210, 310. Because both the IGBTs 210, 310 and the GTOs 220, 320 are OFF at time $t_4$, the current through the IGBTs 210, 310 and GTOs 220, 320 ceases. The load 120 is thereby isolated from the fault condition.

Figure 6:
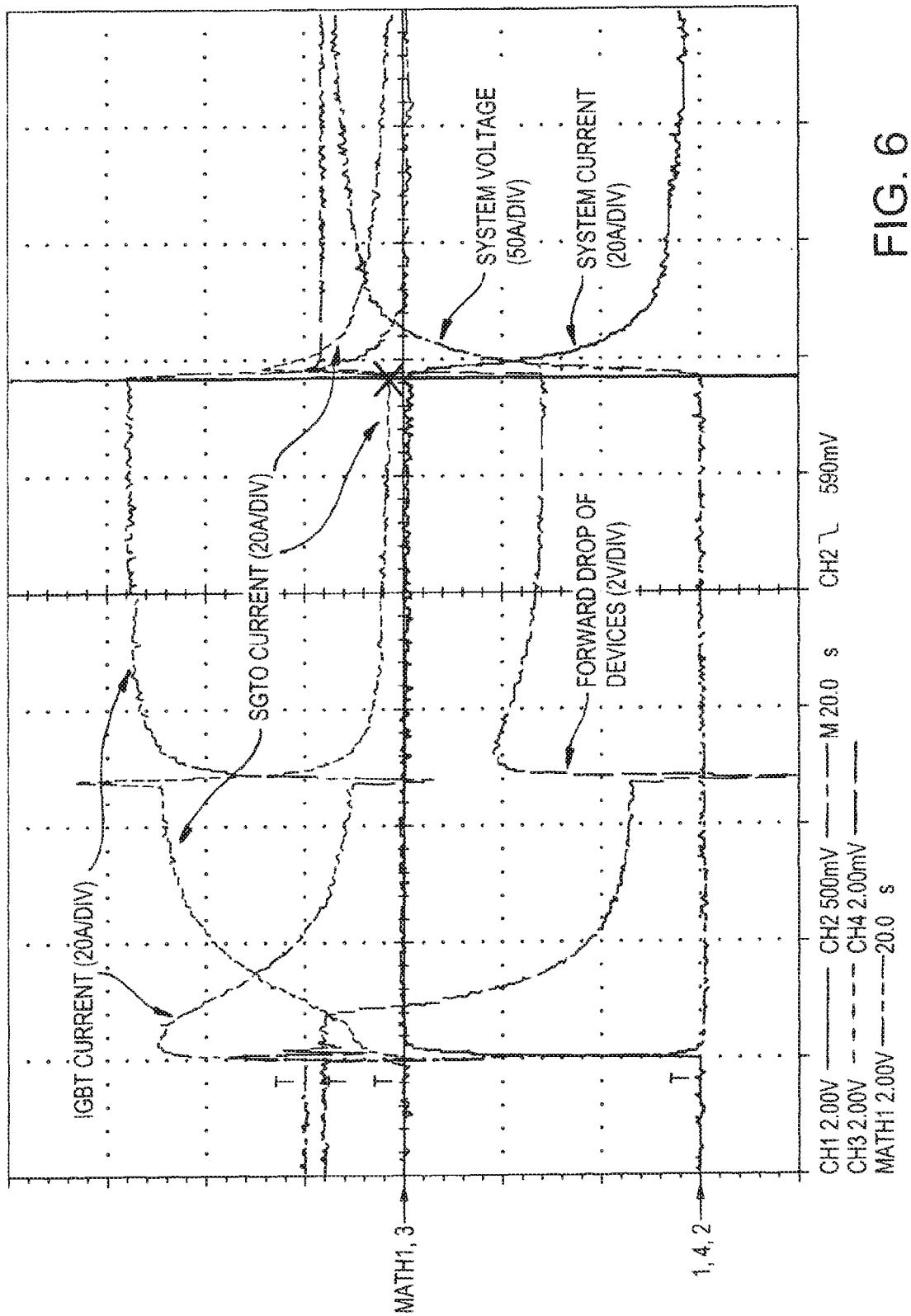
FIG. 6 illustrates various waveforms from an experimental demonstration of the circuit of FIG. 2, in accordance with an exemplary embodiment of the present invention.

Referring now to FIG. 6, there is illustrated experimental results of testing the circuit 300 in the circuit 100, the circuit 300 having one IGBT 310.1 (IXEL40N400 from IXYS Corporation) and one SGTO 320.1 (CCSTA14N40 from Silicon Power, Inc.), in accordance with an exemplary embodiment of the present invention. FIG. 6 specifically illustrates the low voltage turn-OFF of the SGTO 320.1 (4V), the transfer of current to the IGBT 310.1, and the effect remaining stored charge in the SGTO 320.1 have on system current. Both the IGBT 310.1 and the SGTO 320.1 were heated to 125° C. Additionally, the gate drive of the IGBT 310.1 was turned ON around 20 µs shortly before the SGTO 320.1, which was also turned ON around 20 µs after the IGBT 310.1. The IGBT 310.1 was kept ON until 70 µs, at which time it was turned OFF. Thus, FIG. 6 shows that the IGBT 310.1 was turned ON first followed closely by the SGTO 320.1, which explains why the IGBT 310.1 initially carried the majority of load current until just before 28 µs. As also seen in FIG. 6, the system current was 0 A between 0 µs and 20 µs when the IGBT 310.1 and the SGTO 320.1 were OFF. This figure is more exemplary of the inverter application embodiment, however, also demonstrates the capability of the circuit to be used in breaker applications.

As shown in FIG. 6, after the IGBT 310.1 and the SGTO 320.1 were turned ON, the forward drop across these devices decreased and the system current increased to 60 A. At first most of the system current was carried by the IGBT 310.1 just after 20 µs. By 60 µs most of the system current was conducted by the SGTO 320.1, and the forward drop of the devices decreased to $V_F$=1.7V of the SGTO 320.1.

At 70 µs the SGTO 320.1 was turned OFF, and the forward drop of the devices increased to $V_F$=4.0V of the IGBT 310.1, which is approximately twice that of the SGTO 320.1. The system current shifted to the IGBT 310.1 as the SGTO 320 turned OFF after 70 µs. By 140 µs, the IGBT 310.1 conducted most of the system current, and at this time, the controller 130 commanded it to turn OFF by removing the gate signal. It was apparent that not all of the SGTO 320.1 charge recombined between 70 µs and 140 µs, resulting in the increase of SGTO 320.1 current at 140 µs.

As expected, the system 100 current exponentially decayed after the IGBT 310.1 turned OFF at 70 µs. The decay continued until 200 µs, the time it took to fully extract the stored charge from the SGTO 320.1. In the experiment, 70 µs was a predetermined trip point, but it is to be understood that the trip point may be set at other times or based on other factors, such as overcurrent or overvoltage.

With reference to FIGS. 1A, 2, and 3, the increase in fault current through the load 120 should be limited to a value within the safe operating area of the IGBTs 210, 310. The IGBTs 210, 310, themselves, will be able to limit fault current by going into desaturation. However, the power dissipated during this event may raise the junction temperature of the IGBTs 210, 310 enough to lower the safe operating area below the level of current that should be controlled.

Figure 1C:
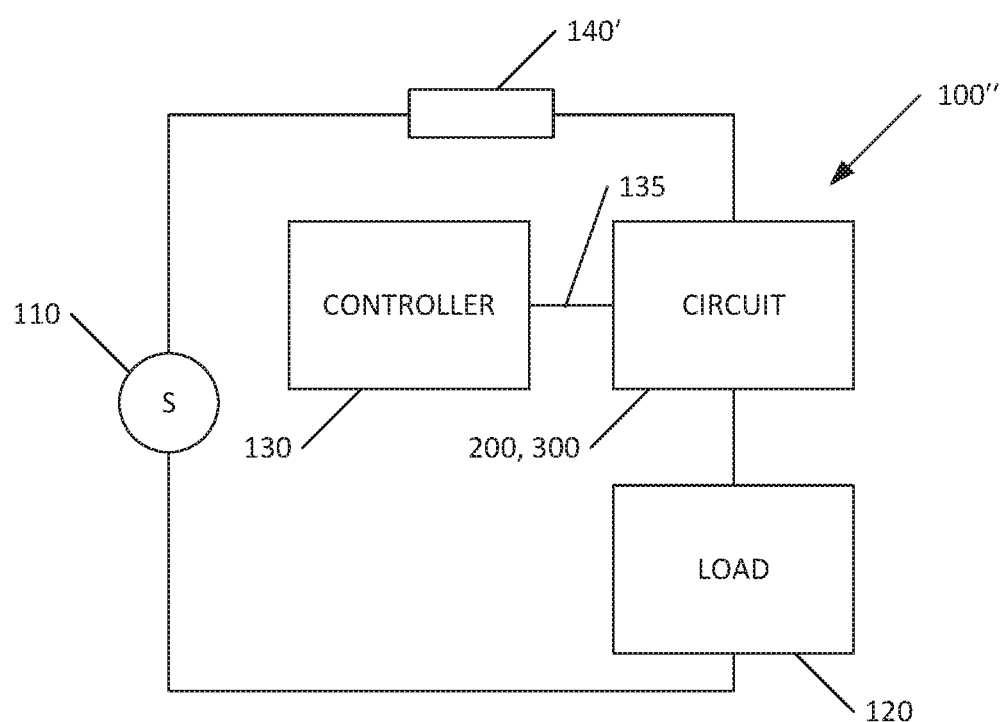
FIG. 1C illustrates a diagram of a circuit comprising a source, a load, a circuit for isolating the load from the source, a controller for controlling the isolation circuit, and a reactance in series with the isolation circuit, in accordance with an exemplary embodiment of the present invention.

Other approaches to limit the fault current to a value within the safe operating area of the IGBTs 310 may be realized at the system level. Referring now to FIG. 1C, there is illustrated an exemplary alternative embodiment of the system 100, generally designated in FIG. 1C as 100", in accordance with an exemplary embodiment of the present invention. The system 100" includes all of the components of the system 100 but further includes a reactance 140' in series with the circuit 200, 300. The reactance 140' limits the di/dt of a fault current to a predetermined level, which enables predictable and repeatable fault interruptions.

In an exemplary embodiment, the source 110 is an AC source. In such embodiment, the SGTOs 220, 320 may have a very high $I^2t$ ratings, meaning the circuit 200, 300 can ride through a surge and interrupt the fault current at the next zero crossing, still leveraging the IGBTs 210, 310 to provide a low clamp voltage.

Figure 7:
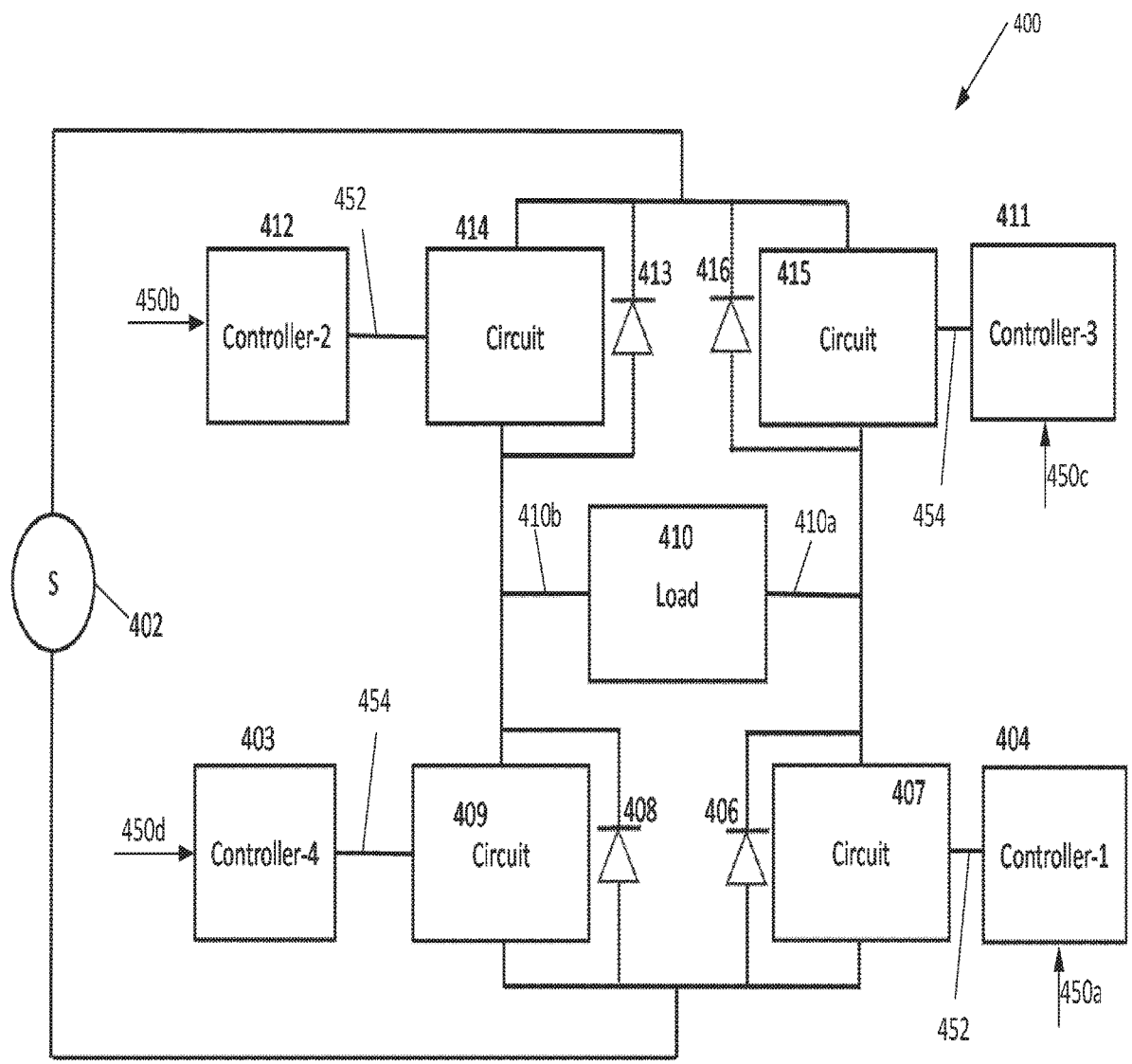
FIG. 7 is a block diagram showing a typical inverter circuit.

An alternative embodiment of the invention is shown in FIGS. 7-10. Referring to FIG. 7, an inverter circuit 400 is shown. This circuit 400 represents an H-bridge inverter where a DC voltage source 402, is allowed to pass through a load 410, through the use of a first, second, third, and fourth circuit 407, 414, 415, 409. Each of a first, second, third, and fourth controller 404, 412, 411, 403 is coupled with a respective one of a first, second, third, and fourth circuit 407, 414, 415, 409. The controllers 404, 412, 411, 403 direct the direction of current flow through the load 410 by turning ON and OFF the respective circuit 407, 414, 415, 409. Each of a first, second, third and fourth diode 406, 413, 416, 408 is coupled in parallel with a respective one of the first, second, third and fourth circuits 407, 414, 415, 409.

Accordingly, the first controller 404 is connected to the first circuit 407, which is connected in parallel with the first diode 406. One end of the first circuit 407 and the first diode 406 is connected to a first end 410a of the load 410. The opposite end of the first circuit 407 and the first diode 406 is connected to one end of the source 402. The second controller 412 is connected to the second circuit 414, which is connected in parallel with the second diode 413. One end of the second circuit 414 and the second diode 413 is connected to a second end 410b of the load 410. The opposite end of the second circuit 414 and the second diode 413 is connected to a second end of the source 402. The third controller 411 is connected to the third circuit 415, which is connected in parallel with the third diode 416. One end of the third circuit 415 and the third diode 416 is connected to a first end 410a of the load 410 (and to the corresponding end of the first circuit 407 and the first diode 406). The opposite end of the third circuit 415 and the third diode 416 is connected to the second end of the source 402 (and to the corresponding end of the second circuit 414 and the second diode 413). The fourth controller 403 is connected to the fourth circuit 409, which is connected in parallel with the fourth diode 408. One end of the fourth circuit 409 and the fourth diode 408 is connected to the second end 410b of the load 410 (and to the corresponding end of the second circuit 414 and the second diode 413). The opposite end of the fourth circuit 409 and the fourth diode 408 is connected to the first end of the source 402 (and to the corresponding end of the first circuit 407 and the first diode 406).

The circuits 407, 414, 415, 409 are turned ON and OFF by the respective controllers 404, 412, 411, 403. When the second and first circuits 414, 407 are both ON at the same time, a current flows from the source 402, through the second circuit 414, through the load 410, through the first circuit 407, and back to the source 402. Thus, when the first and second circuits 407, 414 are turned ON, the current flows in a first direction through the load 410, namely from the second end 410b to the first end 410a. The load 410 is an inductor so the current wants to keep flowing in that same direction through the load 410. So when the first and second circuits (switches) 407, 414 are turned OFF, the only path that the current can take and maintain the current in the same first direction to the load is to go through the third and fourth diodes 416, 408. The third and fourth diodes 416, 408 are freewheeling diodes (FWD) that supply current paths back to the DC source 402, after the turn-OFF of the first and second circuits 407, 414.

Similarly, when the third and fourth circuits 415, 409 are both ON at the same time, current flows from the source 402, through the third circuit 415, through the load 410, through the fourth circuit 409, and back to the source 402. Thus, current flows in a second direction through the load that is opposite the first directly, namely from the first end 410a of the load 410 to the second end 410b of the load. When the third and fourth circuits 415, 409 are turned OFF, the current the current continues to flow in that second direction through the first and second diodes 406, 413.

So there are three states of operation: (a) all the circuits 407, 414, 415, 409 are OFF, in which no current flows through the load 410; (b) the first and second circuits 407, 414 are ON, so that current flows in the first direction through the load 410 from the second end 410b to the first end 410a; and (c) the third and fourth circuits 415, 409 are ON, so that current flows in the second direction through the load 410 from the first end 410a to the second end 410b. It is noted that the first and third circuits, 407, 415 are not turned ON at the same time, since that would short the source 402. Optionally, circuits 414 and 415 or 409 and 407 may be turned simultaneously to short the load. And, no circuit 407, 414, 415, 409 is turned on individually, since that would not cause current to flow through the load 410.

Figure 8:
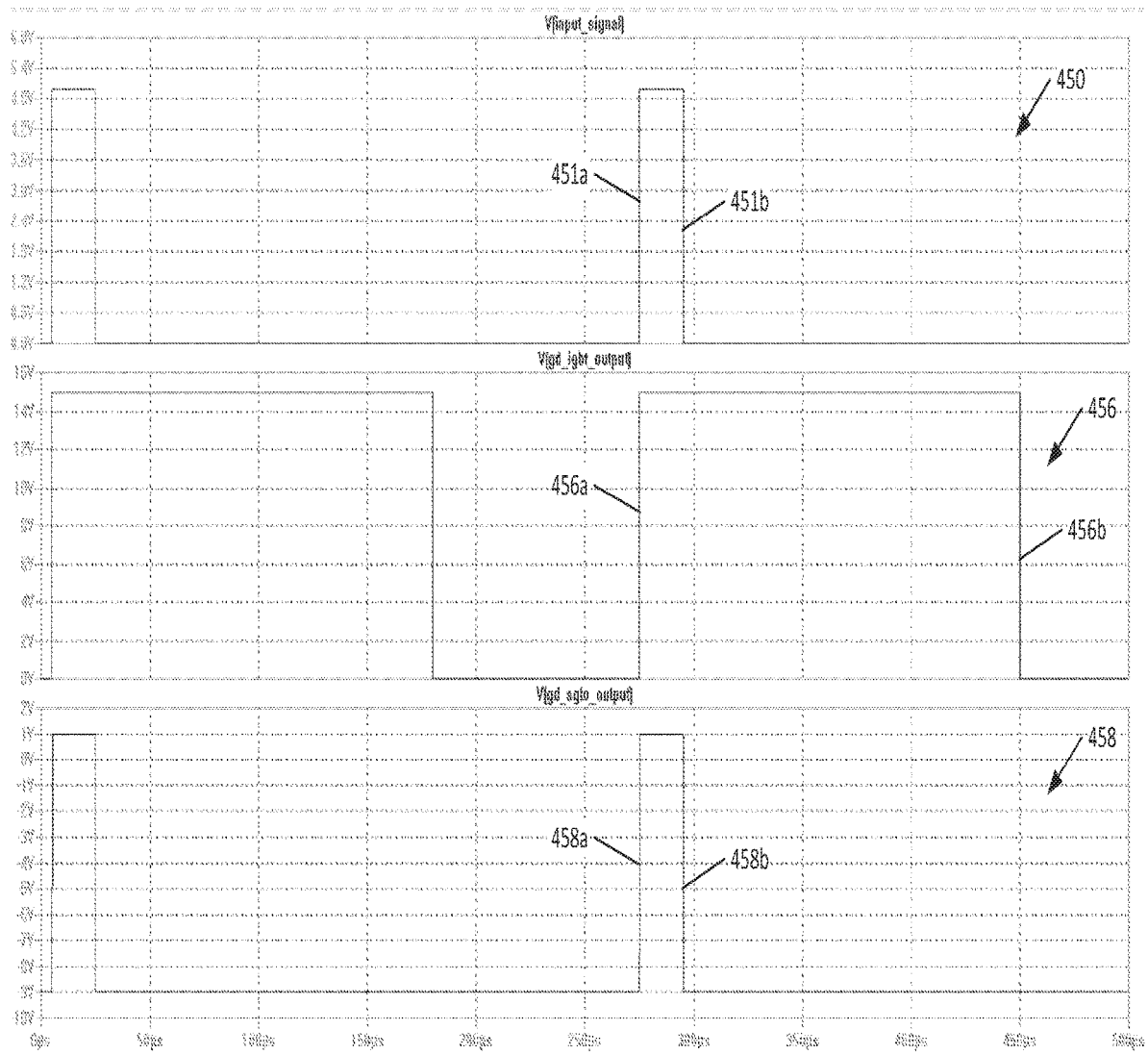
FIG. 8 is a signal diagram showing the input signal and timing delays for turn ON and turn OFF for one or more IGBT and SGTO.

The timing diagram of FIG. 8 details the sequence of operation by the controllers 404, 412, 411, 403. The top of FIG. 8, V(input_signal) represents the input commands 450 supplied by the user. Each of the controllers 404, 412, 411, 403 responds to a different command signal 450, which are respectively labeled 450a, 450b, 450c, 450c in FIG. 7. The controllers 404, 412, 411, 403 convert such input signals 450 to a first control signal 452 or a second control signal 454. The first and second control signals 452, 454 cause the IGBT and/or SGTO to turn ON, as shown by V(gd_igbt_output) signal 456 and V(gd_sgto_output) signal 458. The control signals 452, 454 control the gates of the IGBT and SGTO, respectively, to manage the ON and OFF of the IGBT and SGTO and requisite time delays. When the signal 456 goes high current is allowed to flow through the IGBT(s). When the signal 458 goes high current flows through the SGTO(s). The controllers 404, 412 autonomously convert the input signal 450 into the predetermined timing sequence to allow the IGBT to control turn-ON di/dt and include the appropriate delay, as specified to reflect the minority carrier lifetime chosen for the constituent SGTOs, between SGTO turn-OFF and IGBT turn-OFF.

Here, the circuits 407, 414, 415, 409 can each be a GTO (or SGTO) or IGBT module, such as the ones shown and described with respect to FIGS. 2-3. That is, the circuits 407, 414, 415, 409 each receive the ON/OFF commands from the respective controllers 404, 412, 411, 403. At the rising edge 450a of the input signal 450, the IGBT of the circuits 407, 414, 415, and/or 409 is commanded ON by the rising edge of the respective control signals 452, 454. That is, the rising edge 450a of the input signal 450 causes the controllers 404, 412, 411, and/or 403 to generate the control signal 452, 454. The control signal 452, 454 is sent to the respective circuits 407, 414, 415, 409. The rising edge of the control signals 452, 454 turn ON the IGBT of the circuits 407, 414, 415, and/or 409. In response, the rising edge 456a of the IGBT output is high.

Figure 9:
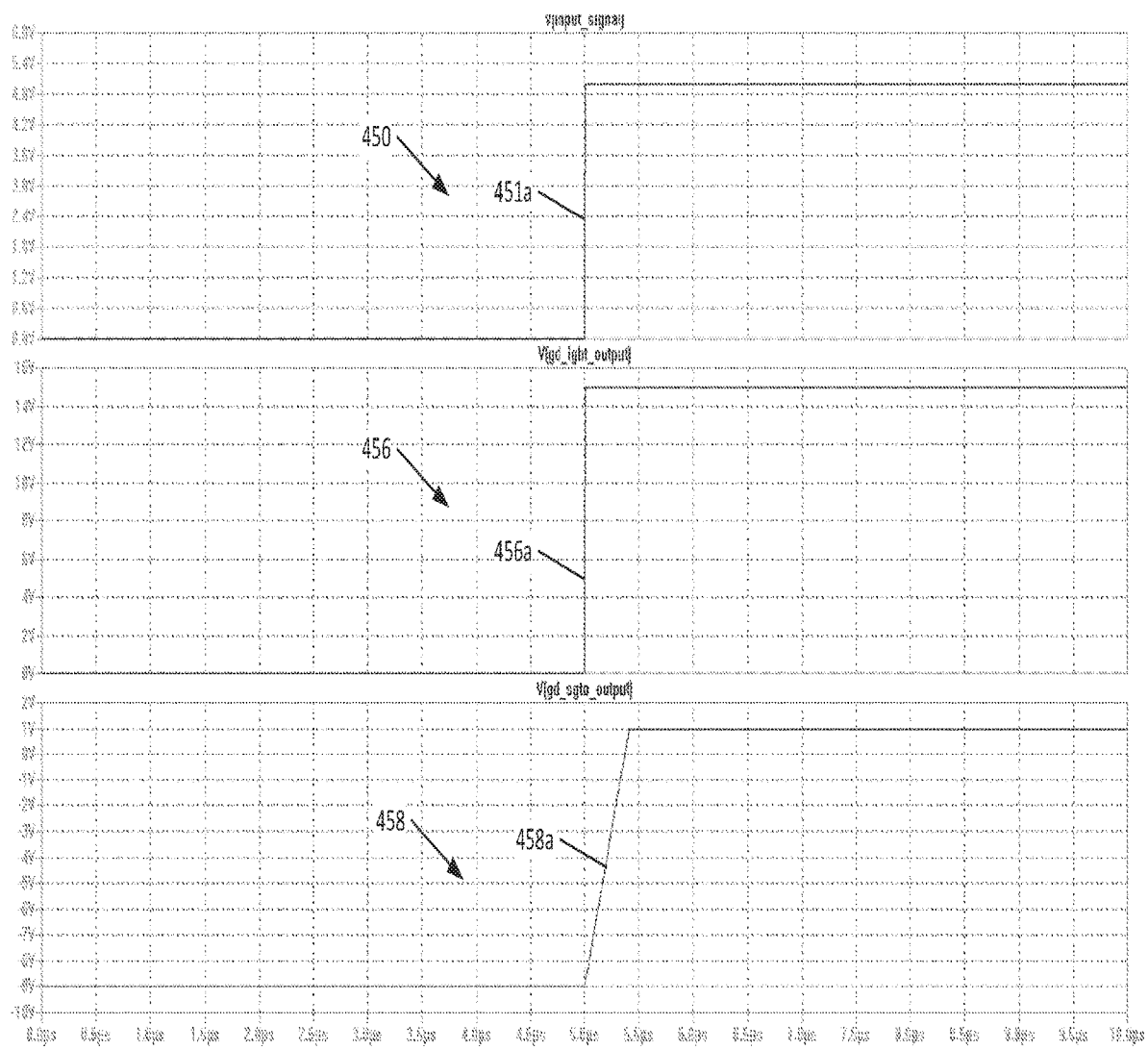
FIG. 9 is a signal diagram showing details of the delay in turn ON signals between one or more IGBT and one or more SGTO.

In addition, after a short predetermined delay, the SGTO is commanded ON. The IGBT is turned ON first, which allows a controlled rate of change of current. The delay is stored in the controllers 404, 412, 411, 403, which receive the input signal then send the predetermined delayed signals to the circuits 407, 412, 411, 403. FIG. 9 shows an exploded view of the signals 450, 456, 458 to illustrate the delay in turn-ON signals between one or more IGBT and one or more SGTO. As shown, the IGBT output 456 has a leading edge 456 that is substantially vertical, whereas the SGTO output 458 has a leading edge 458 that is sloped, which means that there is a slight delay from when the IGBT turns ON to when the SGTO turns ON. This allows the IGBT of the circuit 407, 412, 415, 403 to control turn-ON speed and the SGTO to lower conduction losses.

At the falling edge 450h of the input signal 450, the SGTO is commanded OFF. Thus, the falling edge 450b of the input signal 450 causes the controller 404, 412 to send a control signal 452, 454 to turn OFF the SGTO in the circuit 406, 414. As a result, the SGTO goes OFF at the trailing edge 458b of the SGTO output 458.

After a predetermined delay the IGBT of the circuit is also commanded OFF by the controllers and load current through the circuit is ended. Integrated into the controllers is the signal processing to provide the requisite time-delays detailed in FIG. 8. The first delay is from when the IGBT turns ON to when the SGTO turns ON. That delay is determined by the performance of the diodes 413, 416, 408 and 406. The second delay is from when the SGTO turns OFF to when the IGBT turns OFF. That delay is determined by the performance of the SGTOs within the circuits 414, 415, 409 and 407. The delay between SGTO turn OFF and IGBT turn OFF is directly related to the chosen minority carrier lifetime of the constituent SGTOs for the given operating temperature. The minority carrier lifetime and its respective delay ensure hard turn-off capability of the circuit, eliminating the need to wait for 0-current crossing turn OFF required conventional GTOs. All delays are stored within the controllers 404, 403, 411 and 412. The integrated signal processing simplifies the required inputs 450 to be provided by the end user by requiring only one input signal 450 to control two separately gated portions of the circuit (i.e., the IGBT and the SGTO). This configuration offers superior conduction efficiency of SGTOs, as shown in FIG. 4, the robust turn-OFF offered by the IGBTs, and the ability to control the rate of change of current and/or voltage during the switching event. FIG. 4 demonstrates superior conduction losses of the SGTO over the IGBT, therefore the SGTO is utilized to carry the current when the circuit is in the ON state. When the circuit (switch) transitions from the ON to OFF state or OFF to ON state, the IGBTs are utilized to carry the current because of their ability to control the rate of change of current during those transitions. The SGTO does not have this capability. Thus, FIG. 8 demonstrates the alternative input signal 450 and the timing delays for turn ON and turn OFF of one or more IGBT and SGTO versus the timing used in the original embodiment.

Figure 10:
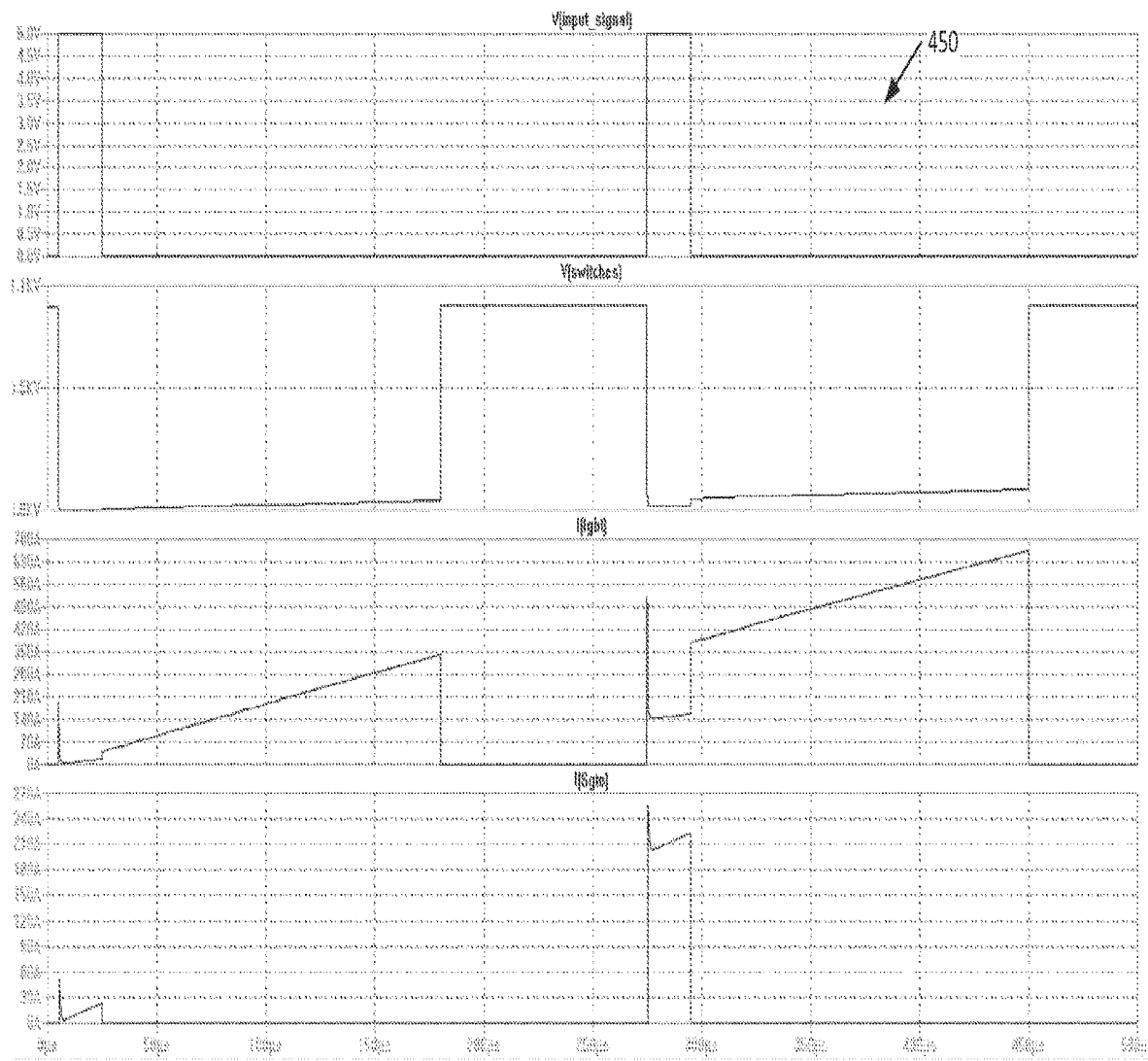
FIG. 10 is a signal diagram illustrating the switching waveform for an inverter circuit.

FIG. 10 represents a double-pulse switching waveform for an inverter test-circuit. FIG. 10 shows the input signal, 450, when 450 goes high the circuit turn ON, voltage across the switch ($2^{nd}$ plot from top) falls. The voltage across the switch when it is ON is lower while the input signal is high, because the SGTO of the circuit is ON while the input signal is high. The $3^{rd}$ and $4^{th}$ plots show the current flowing through the IGBT and SGTO, respectively. At the transition (for example at 275 µs) most of the current flows through the SGTO, when the input signal goes low, all of the current is transferred to the IGBT (at 290 µs). Allowing current to flow solely through the IGBT of the circuit provides the robust, controllable switching speeds of IGBTs, while allowing current to flow through both the IGBT and SGTO of the circuit provides the superior conduction efficiency of SGTOs.

Unless otherwise shown or stated, a connection and coupling refer to one component being directly electrically connected to another component.

These and other advantages of the present invention will be apparent to those skilled in the art from the foregoing specification. Accordingly, it is to be recognized by those skilled in the art that changes or modifications may be made to the above-described embodiments without departing from the broad inventive concepts of the invention. It is to be understood that this invention is not limited to the particular embodiments described herein, but is intended to include all changes and modifications that are within the scope and spirit of the invention.

What is claimed is:

1. A circuit comprising:
   an insulated-gate bipolar transistor (IGBT) coupled to a source and a load, the IGBT including a first gate coupled to a first signal line;
   a gate turn-off thyristor (GTO) connected in parallel with the insulated-gate bipolar transistor, the GTO including a second gate coupled to a second signal line that is independent of the first signal line; and
   a controller coupled to the first signal line and the second signal line, wherein the controller is configured to, in response to detecting a no fault condition:
      initiate activation of the GTO via the second signal line to establish a first connection between the load and the source via the GTO,
   wherein the controller is further configured to, in response to detecting a fault condition:
   initiate activation of the IGBT via the first signal line to establish a second connection between the load and the source via the GTO; and
   initiate deactivation of the GTO via the second signal line to break the first connection.

2. The circuit of claim 1, wherein the controller is further configured to:
   initiate a timer upon initiating deactivation of the GTO; and
   initiate deactivation of the IGBT via the first signal line to break the second connection in response to the timer satisfying a threshold.

3. A circuit comprising:
   a source;
   a load; and
   an isolation circuit disposed between the source and the load, the isolation circuit comprising:
      an insulated-gate bipolar transistor (IGBT), the IGBT including a first gate coupled to a first signal line;
      a gate turn-off thyristor (GTO) connected in parallel with the insulated-gate bipolar transistor, the GTO including a second gate coupled to a second signal line that is independent of the first signal line; and
      a controller coupled to the first signal line and the second signal line, wherein the controller is configured to, in response to detecting a no fault condition:
         initiate activation of the GTO via the second signal line to establish a first connection between the load and the source via the GTO,
      wherein the controller is further configured to, in response to detecting a fault condition:
      initiate activation of the IGBT via the first signal line to establish a second connection between the load and the source via the GTO; and
      initiate deactivation of the GTO via the second signal line to break the first connection.

4. The circuit of claim 3, wherein the controller is further configured to:
   initiate a timer upon initiating deactivation of the GTO; and
   initiate deactivation of the IGBT via the first signal line to break the second connection in response to the timer satisfying a threshold.

5. The circuit of claim 4, wherein the controller is further configured to determine the threshold based on an operating temperature of the GTO.

6. The circuit of claim 4, wherein the controller is further configured to determine the threshold based on a rate of change of an expected fault current through the IGBT.

* * * * *